US012665327B2

(12) United States Patent
Wang et al.

(10) Patent No.: US 12,665,327 B2
(45) Date of Patent: Jun. 23, 2026

(54) BUS CONNECTION CABLE REVERSE-WELDING STRUCTURE

(71) Applicant: JESS-LINK PRODUCTS CO., LTD., New Taipei City (TV)

(72) Inventors: Wen-Yu Wang, New Taipei City (TW); Chieh-Ming Cheng, New Taipei City (TW)

(73) Assignee: JESS-LINK PRODUCTS CO., LTD., New Taipei City (TW)

( * ) Notice: Subject to any disclaimer, the term of this patent is extended or adjusted under 35 U.S.C. 154(b) by 435 days.

(21) Appl. No.: 18/525,357

(22) Filed: Nov. 30, 2023

(65) Prior Publication Data

US 2025/0118912 A1      Apr. 10, 2025

(30) Foreign Application Priority Data

Oct. 4, 2023      (TW) ................................. 112138146

(51) Int. Cl.
| | |
|---|---|
| *H01R 12/62* | (2011.01) |
| *H05K 1/11* | (2006.01) |
| *H01B 7/08* | (2006.01) |
| *H01R 12/72* | (2011.01) |

(52) U.S. Cl.
CPC ............. *H01R 12/62* (2013.01); *H05K 1/115* (2013.01); *H05K 1/117* (2013.01); *H01B 7/08* (2013.01); *H01R 12/72* (2013.01); *H05K 2201/09409* (2013.01); *H05K 2201/10356* (2013.01)

(58) Field of Classification Search
CPC .... H01R 4/029; H01R 12/62; H01R 43/0256; H01R 13/66; H05K 1/115; H05K 1/117; H05K 1/112
USPC ........................ 439/59, 78, 83; 174/250, 262
See application file for complete search history.

(56) References Cited

U.S. PATENT DOCUMENTS

| | | | |
|---|---|---|---|
| 10,424,878 B2 * | 9/2019 | Lloyd .................. | H01R 12/716 |
| 11,677,174 B2 * | 6/2023 | Amini ................ | H01R 13/6581 |
| | | | 439/39 |
| 2010/0267256 A1 * | 10/2010 | Eriguchi .............. | H01R 12/724 |
| | | | 439/83 |
| 2023/0070890 A1 * | 3/2023 | Shrout ............... | H01R 13/6658 |

* cited by examiner

*Primary Examiner* — Tulsidas C Patel
*Assistant Examiner* — Thaslimur Rahman
(74) *Attorney, Agent, or Firm* — HDLS IPR SERVICES; Chun-Ming Shih

(57) ABSTRACT

A bus connection cable reverse-welding structure includes a circuit board, a flat cable, and a first line. The circuit board includes a wiring side, an insertion side, a welding area, a first mating area. A wire exit direction is defined from the wiring side toward the insertion side. The welding area is on the wiring side, and the first mating area is on the insertion side. The flat cable includes a main segment, an attached segment, and a welding end. The main segment extends along the wire exit direction, and the attached segment is attached on the circuit board. The welding end is electrically connected to the welding area. The first line is arranged in the circuit board and includes a first embedded segment and a first extension segment. The first embedded segment is embedded in the circuit board and connected to the welding area.

10 Claims, 9 Drawing Sheets

BUS CONNECTION CABLE REVERSE-WELDING STRUCTURE

BACKGROUND OF THE INVENTION

Technical Field

The present disclosure relates to a bus connection cable, in particular to a bus connection cable reverse-welding structure that adopts reverse welding (or soldering) to achieve reverse wiring and may avoid signal attenuation and impedance mismatch issues.

Description of Related Art

Peripheral Component Interconnect Express (PCIe) bus connection cables are widely used in the connector industry. They mainly include a flat cable and circuit boards and connectors at both ends. Due to the high flexibility of the flat cable itself, which may be bent and twisted, PCIe bus connections may adapt to different installation environments, allowing them to be flexibly installed in a regular or reverse orientation, thus leading to the need for reverse wire orientation in the flat cables.

Specifically, in a regular routing configuration, the flat cable extends in an opposite direction to the circuit board mating position (i.e., where a connector is positioned). In this case, a welding end of the flat cable faces the circuit board and is referred to as "forward welding". Reverse routing, on the other hand, involves the flat cable extending in the same direction toward the circuit board mating position, and it is commonly achieved using a reverse welding method. That is to say, the welding end of the flat cable faces the opposite direction to the circuit board mating position, allowing the flat cable to extend in the same direction toward the circuit board mating position.

However, welding the flat cable to the circuit board results in signals taking additional paths during transmission, leading to stub effects. This may cause issues such as signal attenuation and impedance mismatch. Moreover, this situation becomes more critical when upgrading from PCIe 3.0 to the higher-speed PCIe Gen5, as such effects are exacerbated. Therefore, there is an urgent need to address these drawbacks and design a bus connection cable that may achieve the reverse wiring requirement through reverse welding without producing negative effects.

In light of this, the inventor of this technology has dedicated efforts to research and apply principles to address these issues, aiming to improve the existing technology.

SUMMARY OF THE INVENTION

The primary objective of the present disclosure is to improve bus connection cables when there is a need for reverse wiring. This improvement is intended to address issues related to signal attenuation and impedance mismatch resulting from stub effects caused by the additional signal paths from reverse welding of flat cables.

In order to achieve the above objective, the present disclosure provides a bus connection cable reverse-welding structure, including a circuit board, a flat cable, and a plurality of first lines. The circuit board includes a wiring side and an insertion side opposite to each other, the circuit board includes a welding area and a first mating area, and a wire exit direction defined thereon, wherein the welding area is located on the wiring side, the first mating area is located on the insertion side, and the wire exit direction is defined from the wiring side toward the insertion side. The flat cable includes a main segment, an attached segment, and a plurality of welding ends, the main segment extending along the wire exit direction, the attached segment extending along an opposite direction of the wire exit direction from the main segment and substantially attached to the circuit board, wherein each of the welding ends extends along the opposite direction of the wire exit direction from the attached segment and is electrically connected to the welding area. The plurality of first lines arranged in the circuit board, each of the first lines includes a first embedded segment and a first extension segment, wherein each of the first embedded segments is embedded in the circuit board and connected to one side of the welding area away from the insertion side, and each of the first extension segments is connected to the first mating area and corresponding one of the first embedded segments.

In one embodiment of the present disclosure, the bus connection cable reverse-welding structure further includes a plurality of second lines, the circuit board includes a second mating area, wherein the second mating area is located on the insertion side, the first mating area and the second mating area are arranged at two opposite side surfaces of the circuit board, each of the second lines includes a second embedded segment and a second extension segment, each of the second embedded segments is embedded in the circuit board and connected to one side of the welding area away from the insertion side, and each of the second extension segment is connected to the second mating area and corresponding one of second embedded segments.

In one embodiment of the present disclosure, the circuit board includes a first surface and a second surface opposite to each other, the first mating area is located on the first surface, the welding area is located on the second surface, and each of the first extension segments is disposed on the first surface.

In one embodiment of the present disclosure, the bus connection cable reverse-welding structure further includes a plurality of second lines, the circuit board includes a second mating area, wherein the second mating area is located on the insertion side and arranged on the second surface, each of the second lines includes a second embedded segment and a second extension segment, and each of the second embedded segments is embedded in the circuit board and connected to one side of the welding area away from the insertion side, and the second extension segment includes a first exposed portion, a buried portion, and a second exposed portion, the buried portion is embedded in the circuit board, two ends of the first exposed portion are connected to the second embedded segment and the buried portion respectively, and two ends of the second exposed portion are connected to the buried portion and the second mating area respectively.

In one embodiment of the present disclosure, the circuit board includes a first surface and a second surface opposite to each other, the first mating area is located on the first surface, the welding area is located on the second surface, and each of the first extension segments is embedded within the circuit board.

In one embodiment of the present disclosure, in each of the first extension segments, the first extension segment includes a first extension portion and a first connection portion, the first extension portion is connected to the corresponding first embedded segment, and the first connection portion is connected to the first extension portion and the first mating area.

In one embodiment of the present disclosure, the bus connection cable reverse-welding structure further includes a plurality of second lines, the circuit board includes a second mating area, wherein the second mating area is located on the insertion side and arranged on the second surface, each of the second lines includes a second embedded segment and a second extension segment, each of the second embedded segments is embedded in the circuit board and connected to one side of the welding area away from the insertion side, and each of the second extension segments is embedded in the circuit board and connected to the second mating area and corresponding one of the second embedded segments.

In one embodiment of the present disclosure, the second extension segment includes a second extension portion and a second connection portion, the second extension portion is connected to the corresponding second embedded segment, and the second connection portion is connected to the second extension portion and the second mating area.

In one embodiment of the present disclosure, the bus connection cable reverse-welding structure further includes a connector, wherein the connector is disposed on the insertion side, the main segment includes an inclined portion and a straight portion, the inclined portion is inclinedly connected between the attached segment and the straight portion to make the straight portion bypass an outer edge of the connector.

In one embodiment of the present disclosure, the bus connection cable reverse-welding structure further includes a fastener disposed on the wiring side, wherein the fastener covers each of the wiring ends and at least a portion of the attached segment.

The bus connection cable reverse-welding structure of the present disclosure achieves its purpose by arranging multiple first lines in the circuit board, and each first embedded segment is buried in the circuit board and connected to the welding area on one side away from the insertion side. Additionally, each first extension segment is connected to the first mating area and the corresponding first embedded segment, thus avoiding additional and repeated signal paths. This design effectively prevents issues such as signal attenuation and impedance mismatch caused by stub effects.

DETAILED DESCRIPTION

Figure 1:
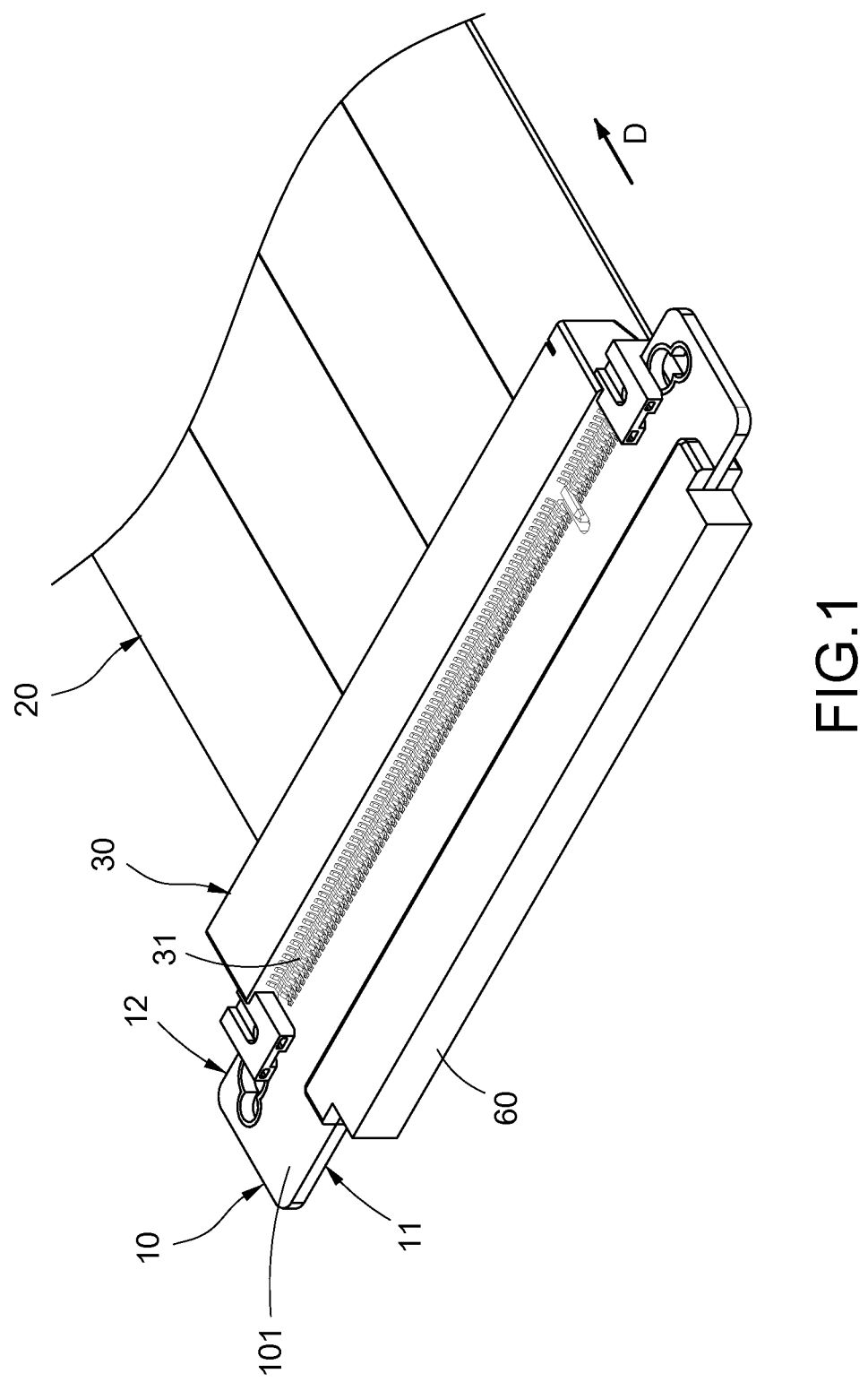
FIG. 1 is a perspective appearance view of a first embodiment of the present disclosure.
Figure 2:
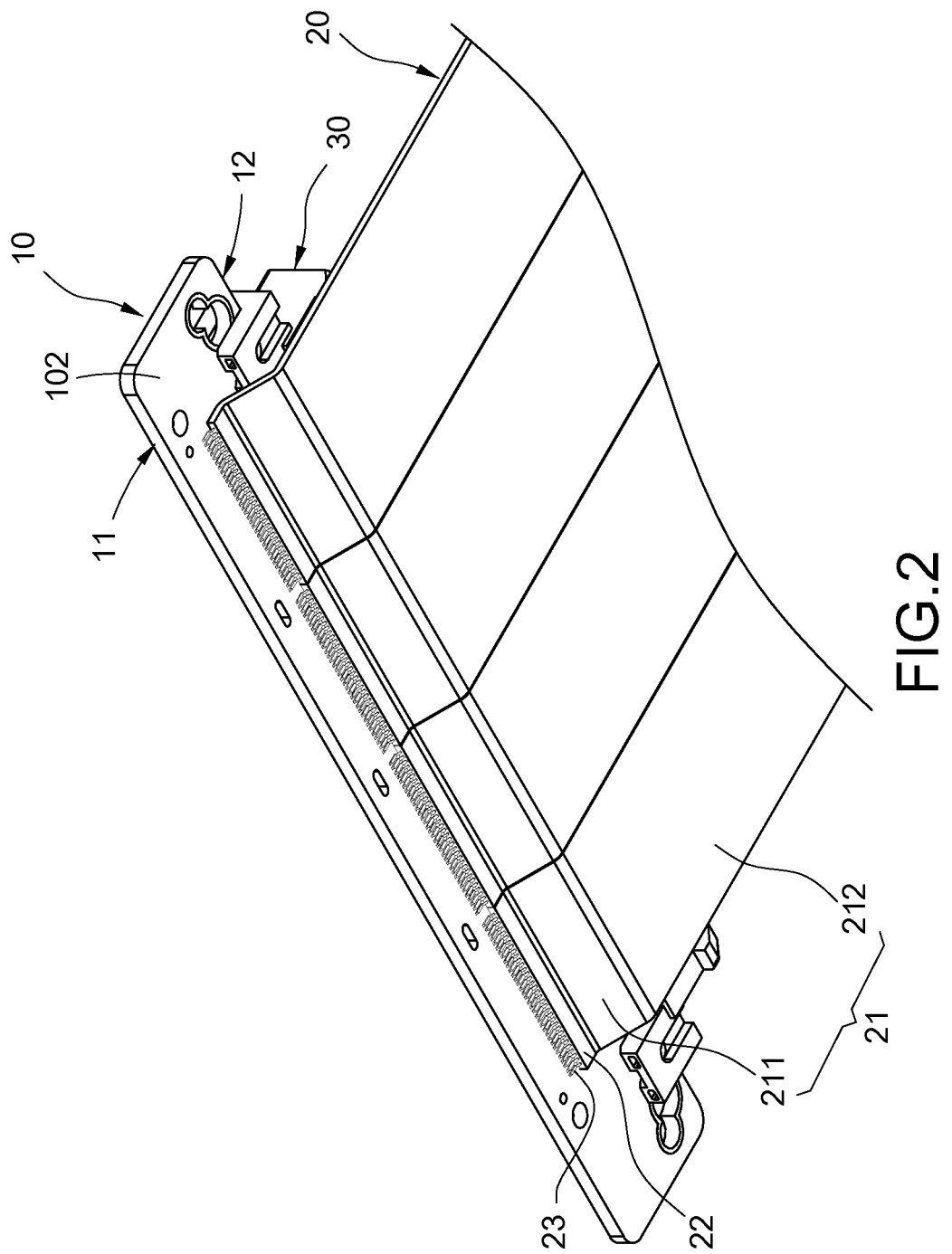
FIG. 2 is a perspective appearance view from another view angle of the first embodiment of the present disclosure.
Figure 3:
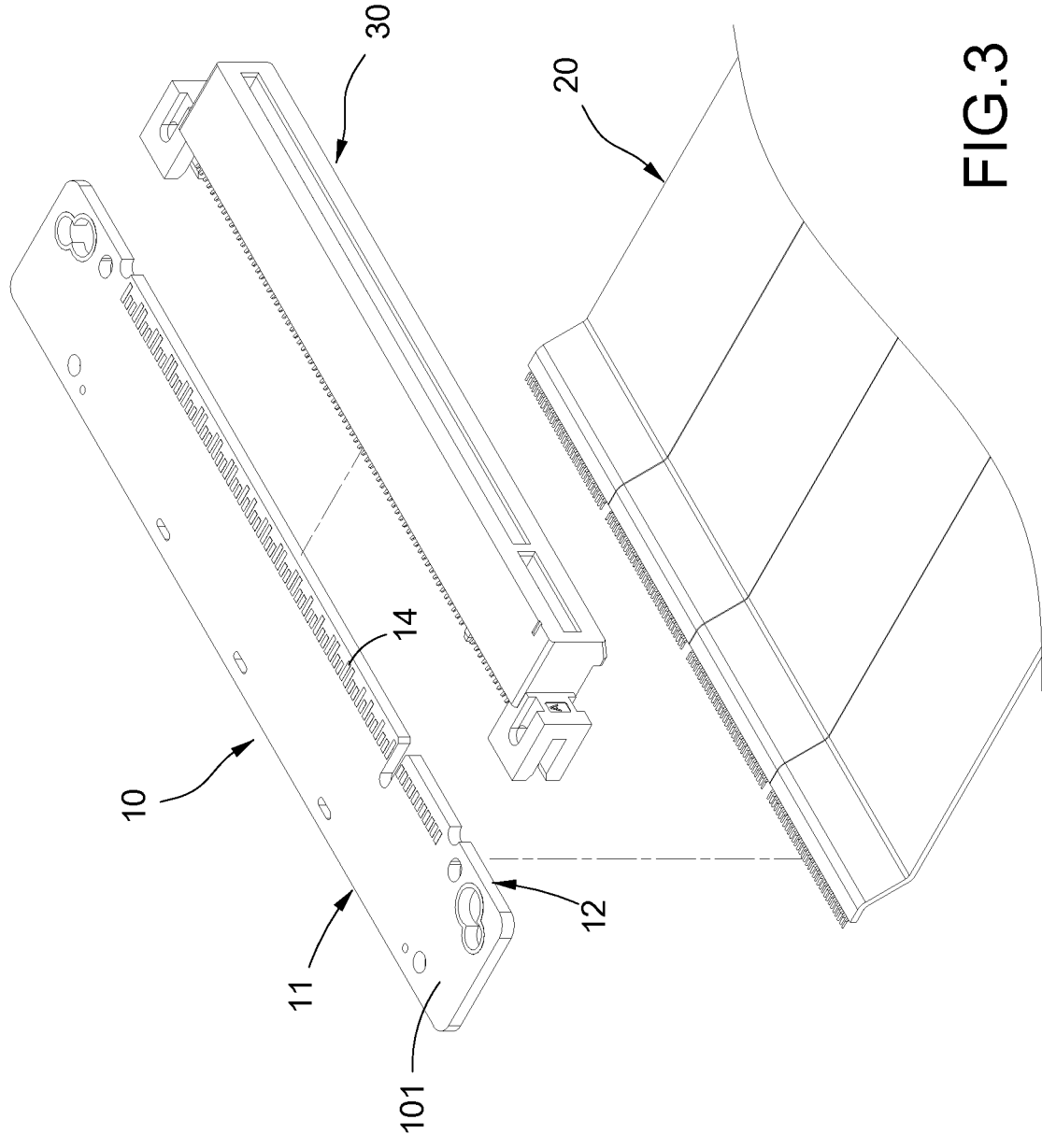
FIG. 3 is an exploded perspective view of the first embodiment of the present disclosure.
Figure 4:
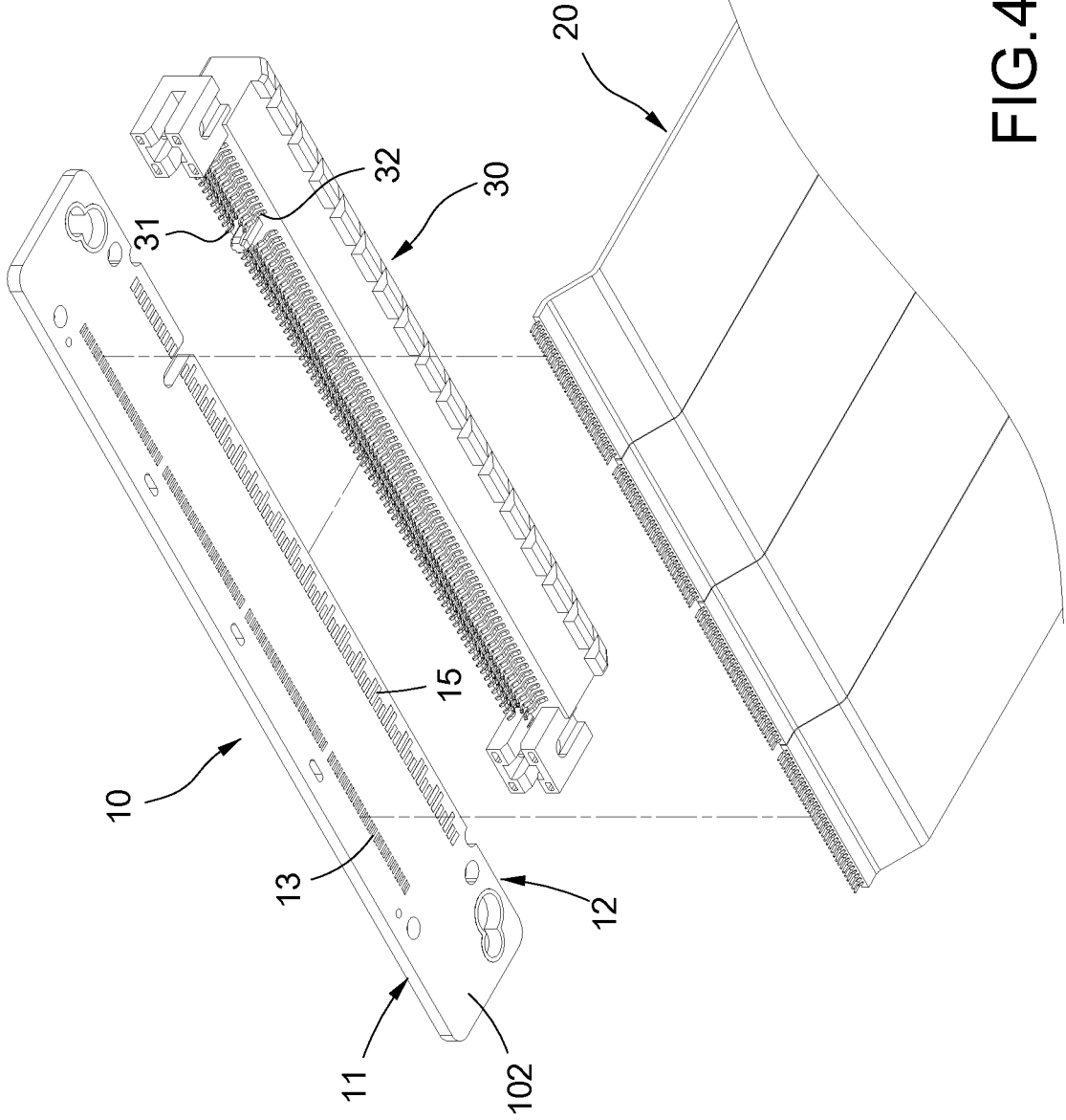
FIG. 4 is an exploded perspective view from another view angle of the first embodiment of the present disclosure.
Figure 5:
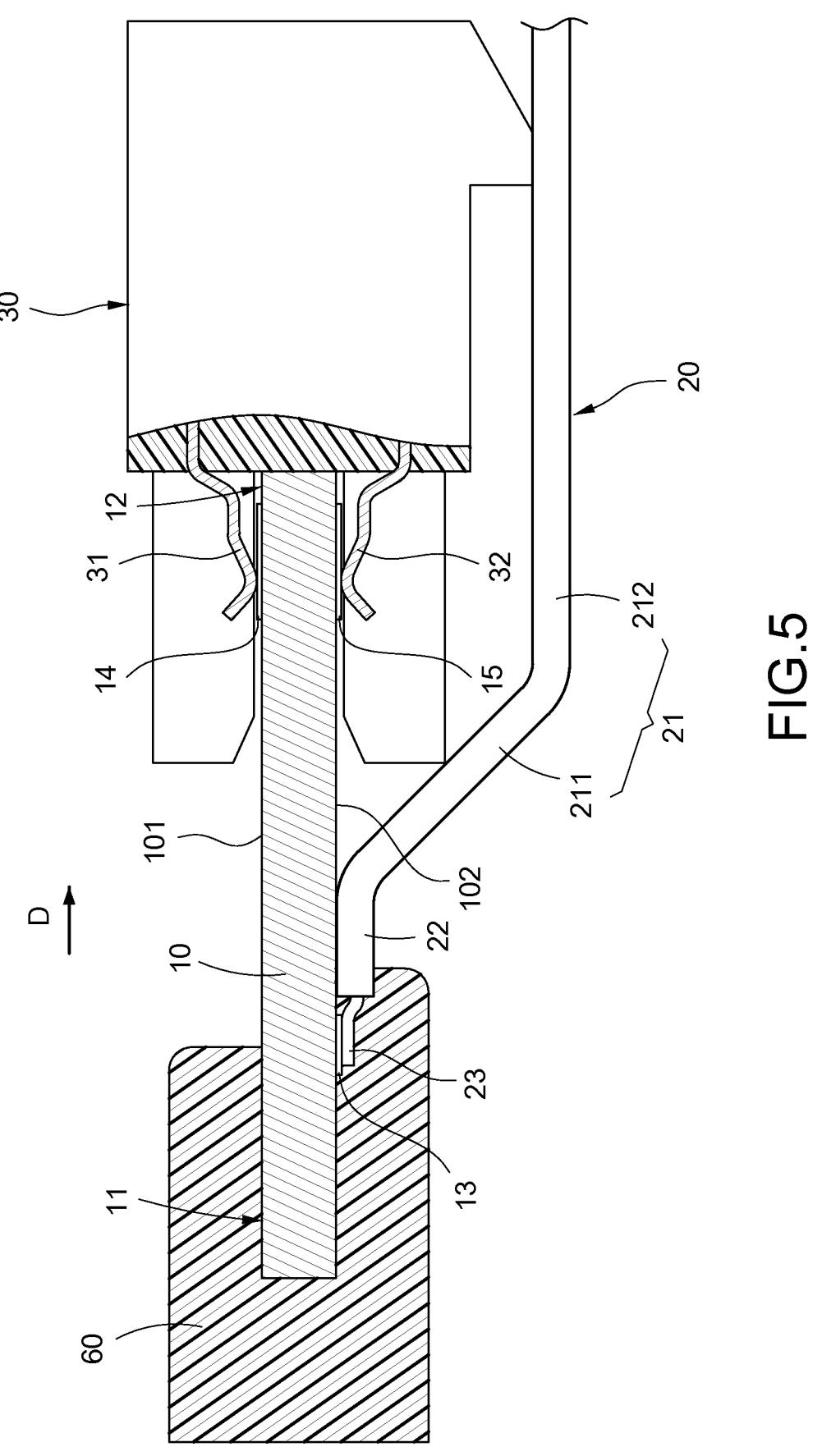
FIG. 5 is a cross-sectional side view of the first embodiment of the present disclosure.
Figure 6:
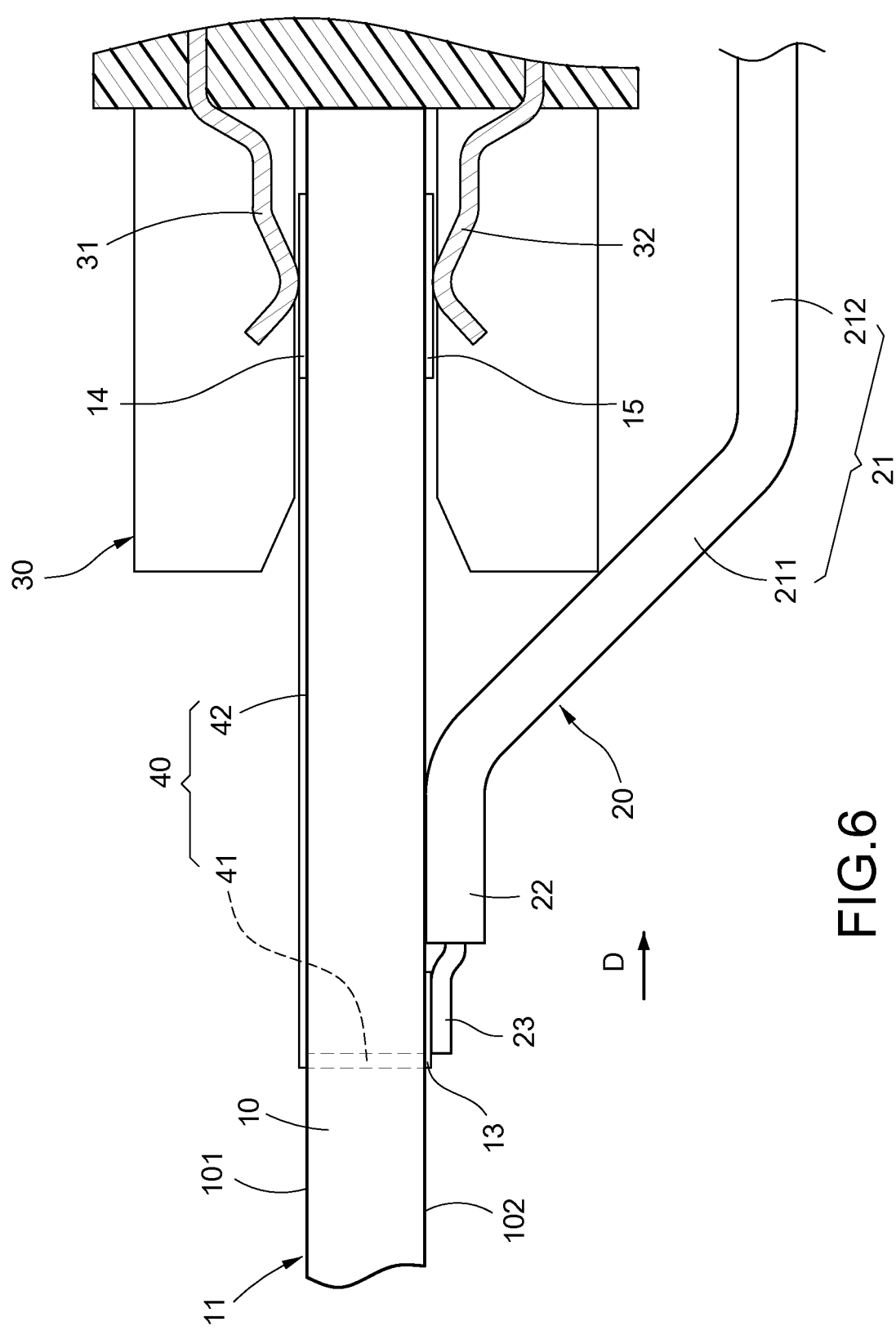
FIG. 6 is a schematic view illustrating wiring of a first line according to the first embodiment of the present disclosure.

In the description of the present disclosure, it is to be understood that the directional terms such as "front", "rear", "left", "right", "front end", "rear end", "end", "longitudinal", "horizontal", "vertical", "top", and "bottom" are based on the orientation or positional relationship shown in the accompanying drawings. The directional terms are only for the convenience of describing the present disclosure and simplifying the description. The directional terms do not indicate or imply that the devices or components referred to must have specific orientations, be constructed or operated in specific orientations. Therefore, the directional terms should not be construed as limitations to the present disclosure.

As used in the present disclosure, terms such as "first", "second", "third", "fourth", and "fifth" are employed to describe various elements, components, regions, layers, and/or parts. These terms should not be construed as limitations to the mentioned elements, components, regions, layers, and/or parts. Instead, they are used merely for distinguishing one element, component, region, layer, or part from another. Unless explicitly indicated in the context, the usage of terms such as "first", "second", "third", "fourth", and "fifth" does not imply any specific sequence or order.

As used herein and not otherwise defined, the terms "substantially" and "approximately" are used to describe and depict small changes. When applied to an event or situation, these terms may encompass the exact moment of the event or situation, as well as a point close in proximity to the occurrence of the event or situation. For example, when applied to a numerical value, these terms may encompass a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

A detailed description and technical content of the present disclosure are described as follows with the accompanying drawings. However, these drawings are provided for illustrative purposes and not intended to limit the protection scope of the present disclosure.

The present disclosure provides a bus connection cable reverse-welding structure. Please refer to FIGS. 1 to 7, which is a first embodiment of the present disclosure, includes a circuit board 10, a flat cable 20, a connector 30, and a plurality of first lines 40.

Referring to FIGS. 1 to 5, the circuit board 10 includes a wiring side 11 and an insertion side 12 opposite to each other. In the present embodiment, the wiring side 11 is arranged on a front side of the circuit board 10, and the insertion side 12 is arranged on a rear side of the circuit board 10. The circuit board 10 is provided with a welding area 13 and a first mating area 14, and a wire exit direction D defined thereon. The welding area 13 is arranged on the wiring side 11, and the first mating area 14 is arranged on the insertion side 12. The wire exit direction D is defined from the wiring side 11 toward the insertion side 12. The first mating area 14 is provided with gold fingers, and a direction of the gold fingers is the same as the wire exit direction D.

Referring to FIGS. 2 to 5, the flat cable 20 includes a main segment 21, an attached segment 22, and a plurality of welding ends 23. The main segment 21 extends along the wire exit direction D, that is, the main segment 21 extends from one side of the circuit board 10 toward the insertion side 12. The attached segment 22 extends from the main segment 21 along an opposite direction of the wire exit direction D and is substantially attached to the circuit board 10. Each of the welding ends 23 extends from the attached segment 22 along the opposite direction of the wire exit direction D and is electrically connected to the welding area 13. Therefore, the flat cable 20 is disposed on one side of the circuit board 10, each of the welding ends 23 faces the opposite direction with respect to the insertion side 12, and the flat cable 20 extends along the wire exit direction D and faces the same direction as the insertion side 12. In this way, reversing welding is utilized to achieve reverse wiring.

It should be noted that "the attached segment 22 is generally attached to the circuit board 10" mentioned here refers to an arrangement of the attached segment 22. That is to say, there may still be a slight gap between the attached segment 22 and the circuit board 10, but it does not mean that the attached segment 22 is completely attached and fixed on the circuit board 10.

Referring again to FIGS. 1 to 5, the connector 30 is disposed on the insertion side 12. The connector 30 includes a plurality of first terminals 31 arranged in a row. Each of the first terminals 31 is elastically connected to the gold fingers of the first mating area 14, so that the connector 30 and the circuit board 10 are electrically connected to transmit signals.

Each of the first lines 40 is arranged on the circuit board 10. Each of the first lines 40 includes a first embedded segment 41 and a first extension segment 42. Each of the first embedded segments 41 is embedded in the circuit board 10 and connected to one side of the welding area 13 away from the insertion side 12. Each of the first extension segments 42 is connected to the first mating area 14 and the corresponding first embedded segment 41.

Accordingly, each of the welding ends 23 faces the opposite direction with respect to the insertion side 12, and the flat cable 20 extends along the wire exit direction D and faces the same direction as the insertion side 12, so that the reversed wiring may be achieved by reverse welding. At the same time, each of the first embedded segments 41 is embedded in the circuit board 10 and connected to one side of the welding area 13 away from the insertion side 12. Each of the first extension segments 42 is connected to the first mating area 14 and the corresponding first embedded segment 41. Therefore, signals may directly enter each first embedded segment 41 after passing through the respective welding end 23, and then be transmitted to the first mating area 14 and the connector 30 through the respective first extension segment 42, thereby preventing signals from going through additional and repeated signal paths. This prevents signal attenuation and impedance mismatch problems caused by stub effect.

For further explanation, referring back to FIGS. 1 to 4, the circuit board 10 has a first surface 101 and a second surface 102 opposite to each other. In the present embodiment, the first surface 101 is an upper surface of the circuit board 10, and the second surface 102 is a lower surface of the circuit board 10, but the present disclosure is not limited in this regard. Please refer to FIG. 6, the first mating area 14 of the present embodiment is arranged on the first surface 101, the welding area 13 is arranged on the second surface 102. Each of the first extension segments 42 of the first lines 40 is arranged on the first surface 101, but the present disclosure is not limited thereto. Specifically, in the present embodiment, each of the first embedded segments 41 is vertically connected between the corresponding first extension segment 42 and the welding area 13, so that each first line 40 has an inverted L shape, but the first embedded segment 41 may also be connected obliquely between the first extension segment 42 and the welding area 13.

In addition, in order to use with the connector 30 having upper and lower rows of overlapping terminals, the bus connection cable reverse-welding structure of the embodiment also includes a plurality of second lines 50, and the circuit board 10 has a second mating area 15, but is provided with a plurality of second lines 50 and second mating areas 15 is not a necessary limitation of the present disclosure. The second mating area 15 is arranged on the insertion side 12 and is provided with golden fingers, and the golden fingers are oriented in a same direction as the wire exit direction D. The first mating area 14 and the second mating area 15 are respectively arranged on opposite sides of the circuit board 10. In the embodiment, the first mating area 14 is arranged on the first surface 101, and the second mating area 15 is arranged on the second surface 102, but it may also be arranged oppositely. The connector 30 is disposed on both the first surface 101 and the second surface 102 of the circuit board 10 and has a plurality of second terminals 32 arranged in a row and arranged up and down with each first terminal 31. Each of the second terminals 32 is elastically connected to the gold fingers of the second mating area 15, so that the connector 30 and the circuit board 10 are electrically connected to transmit signals. Each of the second lines 50 includes a second embedded segment 51 and a second extension segment 52. Each of the second embedded segments 51 is embedded in the circuit board 10 and connected to one side of the welding area 13 away from the insertion side 12. Each of the second extension segments 52 is connected to the second mating area 15 and the corresponding second embedded segments 51.

Accordingly, each of the second embedded segments 51 is embedded in the circuit board 10 and connected to one side of the welding area 13 away from the insertion side 12. Each of the second extension segments 52 is connected to the second mating area 15 and the corresponding second embedded segment 51, so that signals may directly enter each of the second embedded segments 51 after passing through the respective welding end 23, and then be transmitted to the second mating area 15 and the connector 30 through the respective second extension segment 52, which may also prevent the signals from going through additional and repeated paths. This approach prevents signal attenuation and impedance mismatch problems caused by stub effects.

Figure 7:
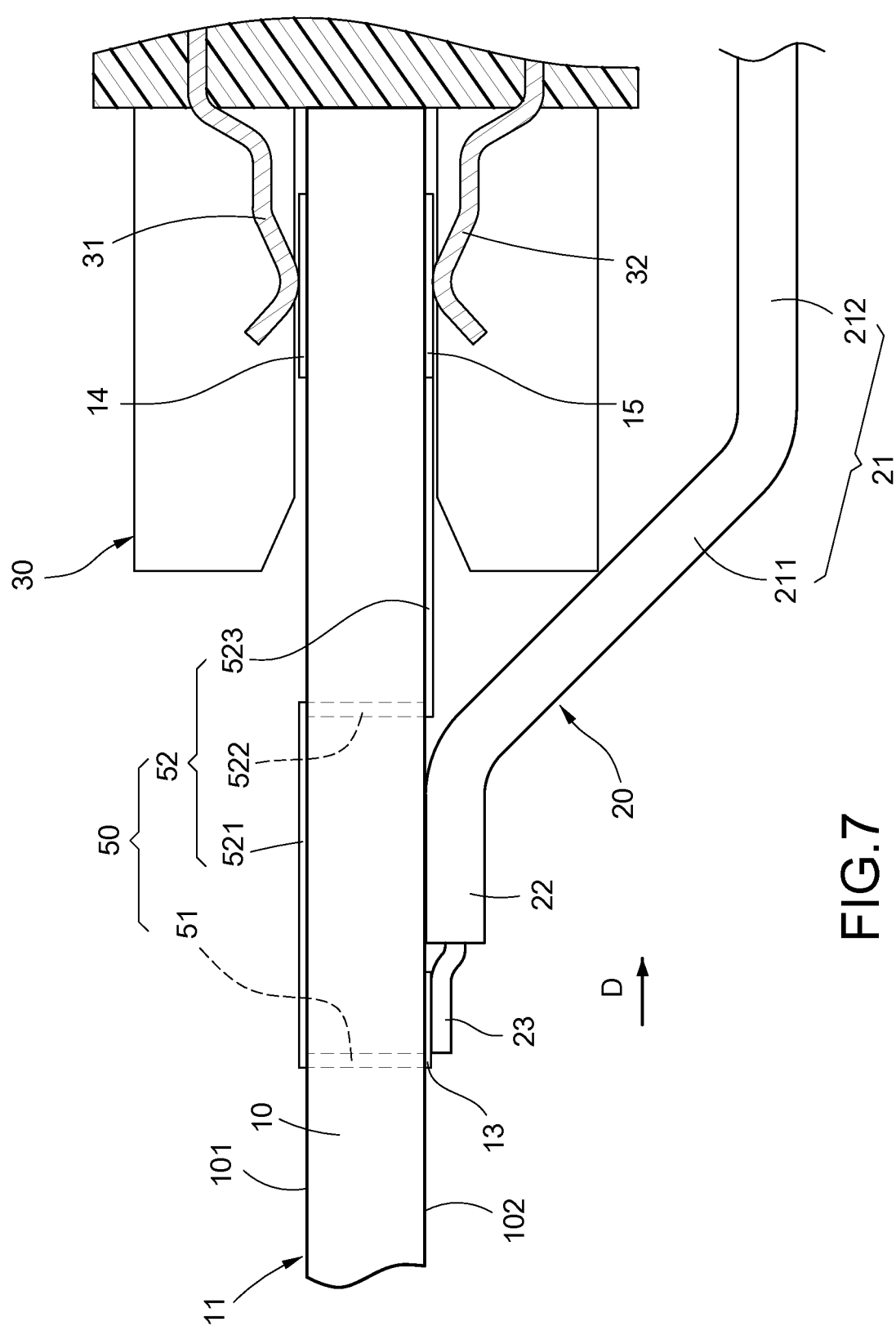
FIG. 7 is a schematic view illustrating wiring of a second line according to the first embodiment of the present disclosure.

Please refer to FIG. 7, in the present embodiment, each of the second extension segments 52 includes a first exposed portion 521, a buried portion 522, and a second exposed portion 523. In each second extension segment 52, the buried portion 522 is embedded in the circuit board 10, two ends of the first exposed portion 521 are respectively connected to the second embedded segment 51 and the buried portion 522, and two ends of the second exposed portion 523 are respectively connected to the buried portion 522 and the second mating area 15. In the present embodiment, each second embedded segment 51 is vertically connected between the welding area 13 and the corresponding first exposed portion 521, and each buried portion 522 is vertically connected between the corresponding first exposed portion 521 and the corresponding second exposed portion 523. Each second extension segment 52 is substantially in a lightning shape, but the present disclosure is not limited thereto.

In particular, when the connector 30 has only one row of terminals (for example, the connector 30 only has the plurality of first terminals 31 or only the plurality of second terminals 32), the connector 30 may be erected on the first surface 101 or the second surface 102 of the circuit board 10, or on both the first surface 101 and the second surface 102 of the circuit board 10. The first mating area 14 may be correspondingly provided on the first surface 101 or the second surface 102 to be connected with the row of terminals of the connector 30. Therefore, if the first mating area 14 is disposed on the first surface 101, each first line 40 may adopt the configuration shown in FIG. 6. When the first mating area 14 is disposed on the second surface 102, each first line 40 may be arranged as the configuration of the second line 50 shown in FIG. 7.

Referring back to FIGS. 2 to 5, the main segment 21 in the present embodiment includes an inclined portion 211 and a straight portion 212, but the present disclosure is not limited thereto. The inclined portion 211 is connected obliquely between the attached segment 22 and the straight portion 212, so that the straight portion 212 may bypass an outer edge of the connector 30 without causing interference. It should be noted that in other embodiments not shown in the drawings, if the connector 30 is directly disposed on the first surface 101, the main segment 21 does not need to form the inclined portion 211, that is, the straight portion 212 may be attached straight along the second surface 102 and extends along the wire exit direction D.

Referring again to FIG. 1 and FIG. 5, the bus connection cable reverse-welding structure of the present embodiment also includes a fastener 60, but the present disclosure is not limited thereto. The fastener 60 is disposed on the wiring side 11 and covers and fixes each welding end 23 and at least a portion of the attached segment 22, thereby protecting each welding end 23 to avoid detachment. Specifically, the fastener 60 in this embodiment is plastic injection molded and integrally formed (or formed in one piece) on one side of the circuit board 10 away from the insertion side 12, but the present disclosure is not limited thereto. For example, the fastener 60 may also be split into two pieces to clamp the circuit board 10 to achieve the effect of covering each welding end 23 and a portion of the attached segment 22.

Figure 8:
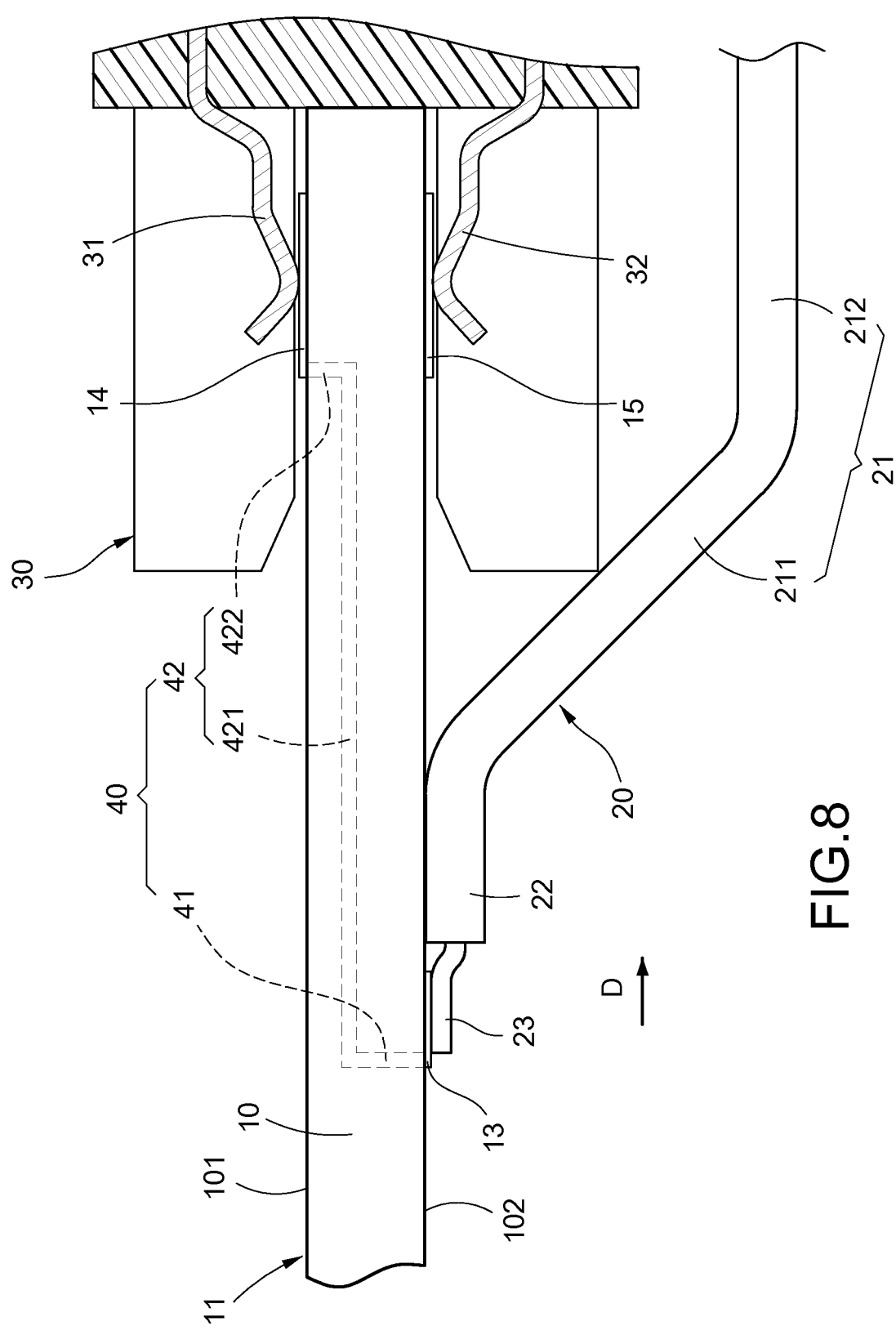
FIG. 8 is a schematic view illustrating wiring of the first line according to a second embodiment of the present disclosure.
Figure 9:
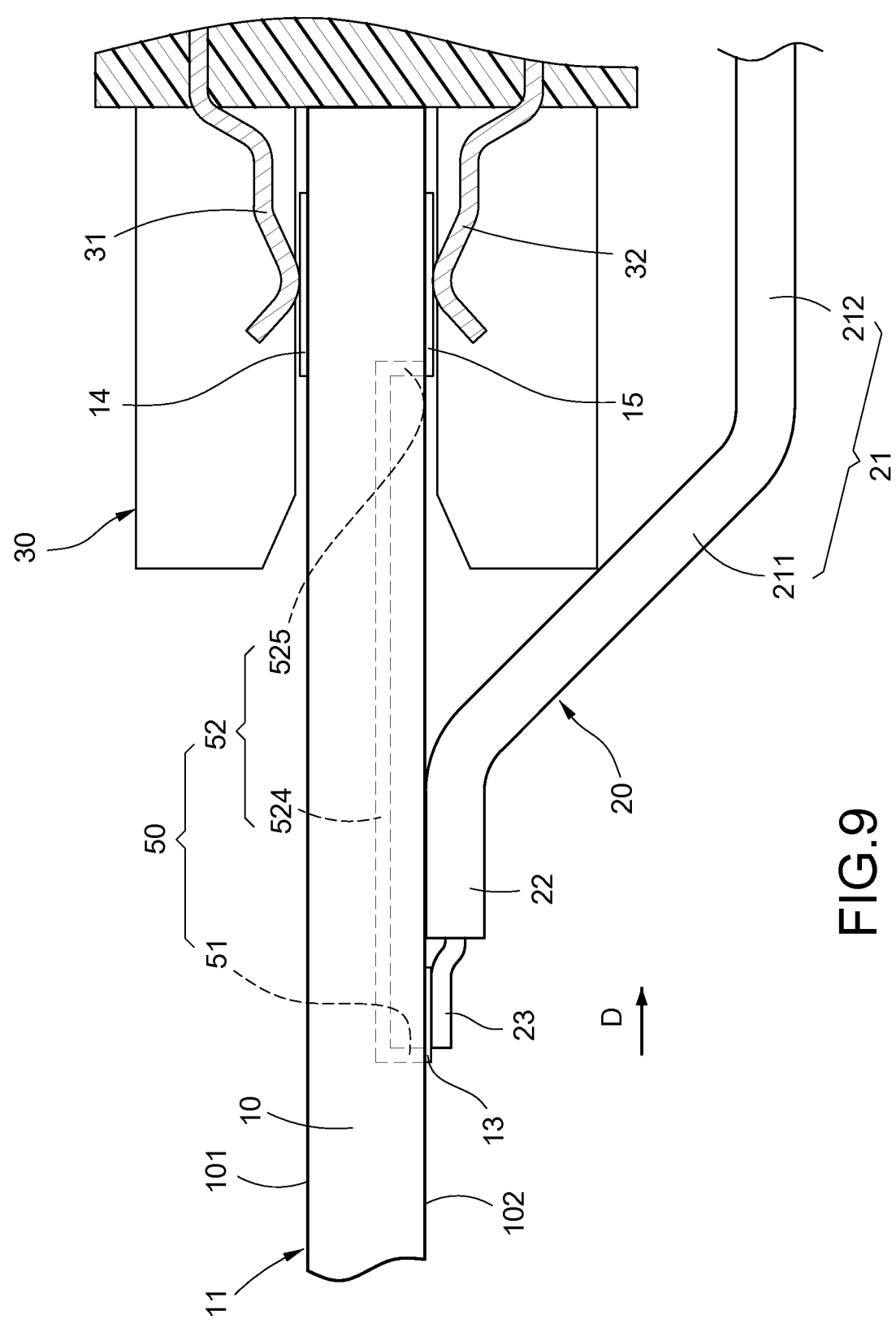
FIG. 9 is a schematic view illustrating wiring of the second line according to the second embodiment of the present disclosure.

Please refer to FIG. 8 and FIG. 9, which show a second embodiment of the present disclosure. The main difference between the second embodiment and the first embodiment lies in the wiring configuration of the first lines 40 and the second lines 50, as explained in detail below.

Please refer to FIG. 8. Each first embedded segment 41 of the first lines 40 is embedded within the circuit board 10 and connected to one side of the welding area 13 away from the insertion side 12. Each first extension segment 42 of the first lines 40 is embedded within the circuit board 10 and connected to the first mating area 14 and the corresponding first embedded segment 41. In this embodiment, each first extension segment 42 includes a first extension portion 421 and a first connection portion 422. In each first extension segment 42, the first extension portion 421 is connected to the corresponding first embedded segment 41, and the first connection portion 422 is connected to the first extension portion 421 and the first mating area 14. In this embodiment, each first embedded segment 41 is vertically connected to the welding area 13 and the corresponding first extension portion 421. Each first connection portion 422 is vertically connected to the corresponding first extension portion 421 and the first mating area 14, thus forming each first extension segment 42 in an inverted L shape. However, it should be noted that the present disclosure is not limited to this configuration.

Please refer to FIG. 9. Each second embedded segment 51 of the second lines 50 is embedded within the circuit board 10 and connected to one side of the welding area 13 away from the insertion side 12. Each second extension segment 52 of the second lines 50 is embedded within the circuit board 10 and connected to the second mating area 15 and the corresponding second embedded segment 51. In this embodiment, each second extension segment 52 includes a second extension portion 524 and a second connection portion 525. In each second extension segment 52, the second extension portion 524 is connected to the corresponding second embedded segment 51, and the second connection portion 525 is connected to the second extension portion 524 and the second mating area 15. In this embodiment, each second embedded segment 51 is vertically connected to the welding area 13 and the corresponding second extension portion 524, and each second connection portion 525 is vertically connected to the corresponding second extension portion 524 and the second mating area 15, thus forming each second extension segment 52 in an inverted U shape. However, it should be noted that the present disclosure is not limited to this configuration.

In this way, in the second embodiment, each of the first lines 40 and the second lines 50 is concealed within the circuit board 10 and not exposed externally. This effectively reduces signal interference for the first lines 40 and the second lines 50, which may occur if the first lines 40 and the second lines 50 are exposed. This also prevents oxidation and contamination due to contact with the external air and environment, thus enhancing the lifespan. Furthermore, it achieves the reverse wiring while avoiding signal attenuation and impedance mismatch caused by the stub effect resulting from reverse welding.

The bus connection cable reverse-welding structure of this disclosure, with each welding end 23 and the insertion side 12 facing in opposite directions, and the flat cable 20 extending along the wire exit direction D in the same direction as the insertion side 12, allows the reverse welding to achieve the reverse wiring. Simultaneously, each first embedded segment 41 is embedded within the circuit board 10 and connected to one side of the welding area 13 away from the insertion side 12, and each first extension segment 42 is connected to the first mating area 14 and the corresponding first embedded segment 41. This arrangement ensures that signals may directly enter each first embedded segment 41 after passing through each welding end 23 and is then transmitted to the first mating area 14 and the connector 30 through each first extension segment 42. This design prevents signals from going through extra and repeated paths and prevents signal attenuation and impedance mismatch caused by the stub effects.

It also allows for various other embodiments that do not depart from the spirit and substance of the disclosure. Those skilled in the art may make various corresponding changes and modifications based on this disclosure. Such changes and modifications are deemed to fall within the scope of protection covered by the patent claims of this disclosure.

What is claimed is:

1. A bus connection cable reverse-welding structure, comprising:
   a circuit board, comprising a wiring side and an insertion side opposite to each other, a welding area, a first mating area, and a wire exit direction defined thereon, wherein the welding area is located on the wiring side, the first mating area is located on the insertion side, and the wire exit direction is defined from the wiring side toward the insertion side;
   a flat cable, comprising a main segment, an attached segment, and a plurality of welding ends, the main segment extending along the wire exit direction, the attached segment extending along an opposite direction of the wire exit direction from the main segment and substantially attached to the circuit board, wherein each of the welding ends extends along the opposite direction of the wire exit direction from the attached segment and is electrically connected to the welding area; and a plurality of first lines, arranged in the circuit board, each of the first lines comprising a first embedded segment and a first extension segment, wherein each of the first embedded segments is embedded in the circuit board and connected to one side of the welding area away from the insertion side, and the first extension segment is connected to the first mating area and the first embedded segment.

2. The bus connection cable reverse-welding structure according to claim 1, further comprising a plurality of second lines, the circuit board comprising a second mating area, wherein the second mating area is located on the insertion side, the first mating area and the second mating area are arranged at two side surfaces of the circuit board opposite to each other, each of the second lines comprises a second embedded segment and a second extension segment, the second embedded segment is embedded in the circuit board and connected to one side of the welding area away from the insertion side, and the second extension segment is connected to the second mating area and the second embedded segment.

3. The bus connection cable reverse-welding structure according to claim 1, wherein the circuit board comprises a first surface and a second surface opposite to each other, the first mating area is located on the first surface, the welding area is located on the second surface, and a plurality of first extension segments are disposed on the first surface.

4. The bus connection cable reverse-welding structure according to claim 3, further comprising a plurality of second lines, the circuit board comprising a second mating area, wherein the second mating area is located on the insertion side and arranged on the second surface, each of the second lines comprises a second embedded segment and a second extension segment, and the second embedded segment is embedded in the circuit board and connected to one side of the welding area away from the insertion side, and the second extension segment comprises a first exposed portion, a buried portion, and a second exposed portion, the buried portion is embedded in the circuit board, two ends of the first exposed portion are connected to the second embedded segment and the buried portion, and two ends of the second exposed portion are connected to the buried portion and the second mating area.

5. The bus connection cable reverse-welding structure according to claim 1, wherein the circuit board comprises a first surface and a second surface opposite to each other, the first mating area is located on the first surface, the welding area is located on the second surface, and the first extension segment is embedded in the circuit board.

6. The bus connection cable reverse-welding structure according to claim 5, wherein the first extension segment comprises a first extension portion and a first connection portion, the first extension portion is connected to the first embedded segment, and the first connection portion is connected to the first extension portion and the first mating area.

7. The bus connection cable reverse-welding structure according to claim 5, further comprising a plurality of second lines, the circuit board comprising a second mating area, wherein the second mating area is located on the insertion side and arranged on the second surface, each of the second lines comprises a second embedded segment and a second extension segment, the second embedded segment is embedded in the circuit board and connected to one side of the welding area away from the insertion side, and the second extension segment is embedded in the circuit board and connected to the second mating area and the second embedded segment.

8. The bus connection cable reverse-welding structure according to claim 7, wherein the second extension segment comprises a second extension portion and a second connection portion, the second extension portion is connected to the second embedded segment, and the second connection portion is connected to the second extension portion and the second mating area.

9. The bus connection cable reverse-welding structure according to claim 1, further comprising a connector disposed on the insertion side, wherein the main segment comprises an inclined portion and a straight portion, the inclined portion is inclinedly connected between the attached segment and the straight portion to make the straight portion bypass an outer edge of the connector.

10. The bus connection cable reverse-welding structure according to claim 1, further comprising a fastener disposed on the wiring side and covering each of the welding ends and at least a portion of the attached segment.

\* \* \* \* \*